(12) United States Patent
Matsubara et al.

(10) Patent No.: US 10,546,783 B2
(45) Date of Patent: Jan. 28, 2020

(54) MANUFACTURING PROCESS OF ELEMENT CHIP AND SUBSTRATE HEATING APPARATUS

(71) Applicant: Panasonic Intellectual Property Management Co., Ltd., Chuo-ku, Osaka-shi (JP)

(72) Inventors: Noriyuki Matsubara, Osaka (JP); Hidehiko Karasaki, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/008,280

(22) Filed: Jun. 14, 2018

(65) Prior Publication Data

US 2019/0006238 A1    Jan. 3, 2019

(30) Foreign Application Priority Data

Jun. 28, 2017   (JP) .................................. 2017-126365

(51) Int. Cl.
*H01L 21/82* (2006.01)
*H01L 21/683* (2006.01)
(Continued)

(52) U.S. Cl.
CPC ............ *H01L 21/82* (2013.01); *B23K 26/364* (2015.10); *H01L 21/3081* (2013.01);
(Continued)

(58) Field of Classification Search
CPC ..... H01L 21/82; H01L 21/78; H01L 21/3081; H01L 21/6836; H01L 21/67069;
(Continued)

(56) References Cited

U.S. PATENT DOCUMENTS 6,582,983 B1 *  6/2003  Runyon ............. H01L 21/6835
                                          257/E23.02
2010/0216313 A1 *  8/2010  Iwai .................. H01J 37/32623
                                          438/729
(Continued)

FOREIGN PATENT DOCUMENTS

JP    2014-513868 A    6/2014
JP    2014-523112 A    9/2014
(Continued)

*Primary Examiner* — Dao H Nguyen
(74) *Attorney, Agent, or Firm* — Pearne & Gordon LLP

(57) ABSTRACT

Provided is a manufacturing process of an element chip, which comprises a preparing step for preparing a substrate containing element regions and dicing regions, a holding step for holding the substrate and a frame with a holding sheet, an applicating step for applying a resin material solution containing a resin constituent and a solvent on the substrate to form a coated layer containing the resin constituent and the solvent thereon, a heating step for heating the substrate held on the holding sheet through a heat shielding member shielding the frame and the holding sheet to substantially remove the solvent from the coated layer, thereby to form a resin layer, a patterning step for patterning the resin layer to expose the substrate in the dicing regions, and a dicing step for dicing the substrate into element chips by plasma-etching the substrate.

18 Claims, 6 Drawing Sheets

(51) Int. Cl.
  *B23K 26/364* (2014.01)
  *H01L 21/67* (2006.01)
  *H01L 21/308* (2006.01)
  *H01L 21/3065* (2006.01)
(52) U.S. Cl.
  CPC .. *H01L 21/30655* (2013.01); *H01L 21/67069* (2013.01); *H01L 21/67207* (2013.01); *H01L 21/6833* (2013.01); *H01L 21/6836* (2013.01)
(58) Field of Classification Search
  CPC ........... H01L 21/67207; H01L 21/6833; H01L 21/30655; B23K 26/08; B23K 26/402; B23K 26/0622; B23K 26/364
  USPC ....... 438/106, 113, 114, 459, 460, 463, 462, 438/464, 612, 681; 257/620, 621, 642, 257/685, 723, 738, 758, 765, 787, 257/E21.001, E21.214, E21.237, E21.502, 257/E21.503, E21.602, E23.002, E23.021, 257/E23.039, E23.062, E23.063, E23.114
  See application file for complete search history.

(56) References Cited

U.S. PATENT DOCUMENTS

| | | | |
|---|---|---|---|
| 2012/0021608 A1* | 1/2012 | Arita | H01L 21/6835 438/703 |
| 2012/0238073 A1* | 9/2012 | Johnson | H01L 21/3065 438/464 |
| 2015/0221505 A1* | 8/2015 | Park | H01L 21/02282 438/782 |
| 2018/0090333 A1* | 3/2018 | Matsubara | H01L 21/3086 |

FOREIGN PATENT DOCUMENTS

| | | |
|---|---|---|
| WO | 2012-125560 A2 | 9/2012 |
| WO | 2012-173768 A2 | 12/2012 |

* cited by examiner

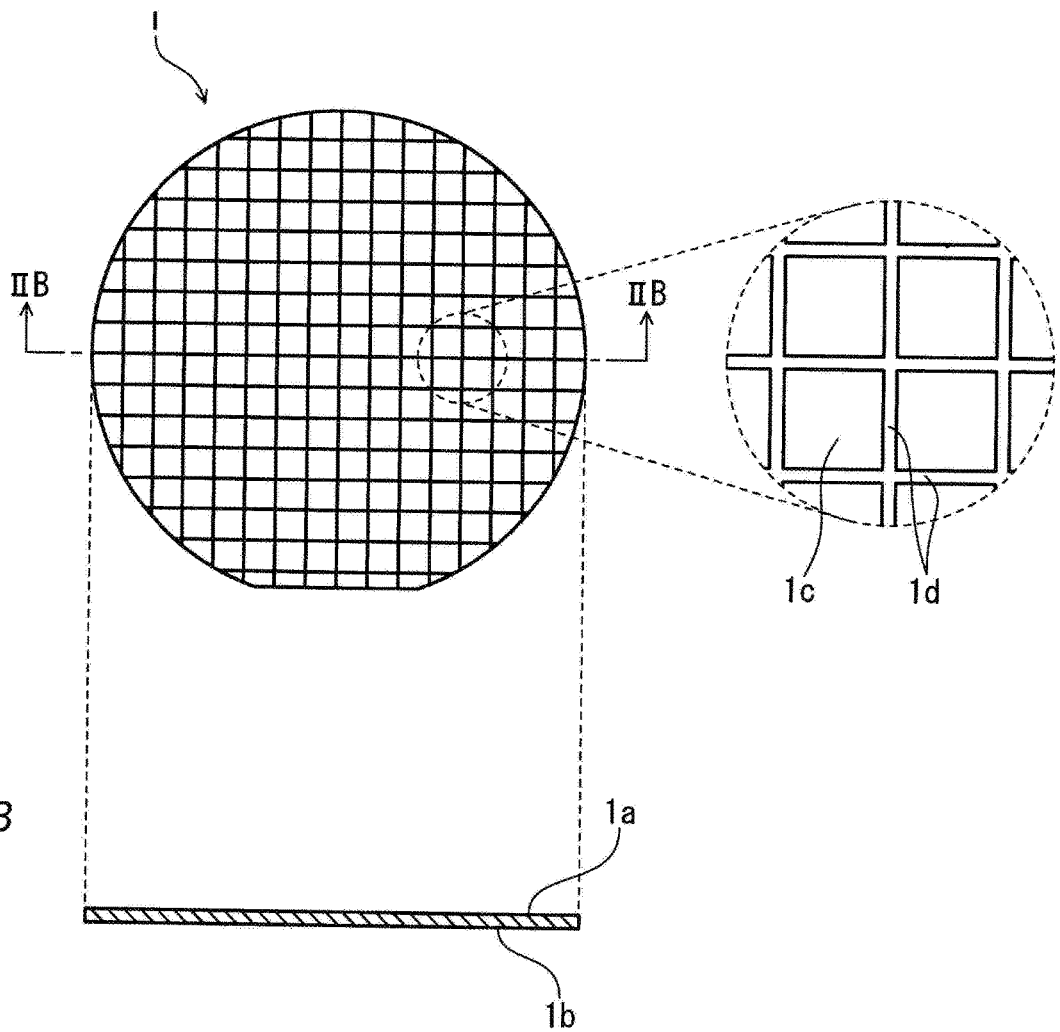

MANUFACTURING PROCESS OF ELEMENT CHIP AND SUBSTRATE HEATING APPARATUS

CROSS REFERENCE TO RELATED APPLICATION

The present application is based on and claims priority under 35 U.S.C. § 119 with respect to the Japanese Patent Application No. 2017-126365, filed on Jun. 28, 2017, of which entire content is incorporated herein by reference into the present application.

TECHNICAL FIELD

The present invention relates to a manufacturing process of an element chip and a substrate heating apparatus, and in particular to the manufacturing process of the element chip including a step for plasma-etching the substrate held on a holding sheet, and to the substrate heating apparatus performing the manufacturing process.

BACKGROUND

There are some known processes for individualizing or dicing a semiconductor substrate into a plurality of element chips, including for example, a blade-dicing process using a mechanical cutting technique with a blade cutter, a laser-dicing process using a laser processing technique, and a plasma-dicing process using a plasma processing technique. The dicing processes are performed on the semiconductor substrate while being adhered on a holding sheet held on a frame, in order to facilitate handling of a thin substrate to be processed and/or a plurality of the elemental chips after being diced.

Unlike the blade-dicing process and the laser-dicing process, the plasma-dicing process has an advantage achieving a high processing efficiency even if the number of the element chips is enormous since it collectively processes the whole substrate surface. However, since the plasma-dicing process is performed to dice the substrate through a plasma exposure across the whole substrate surface, it requires a coating on element regions of the substrate and a mask having a pattern uncovering dicing regions of the substrate. The mask may be formed by a photolithography technique or a laser-grooving technique.

The mask formation by the photolithography technique is achieved by heating a resist solution applied on the substrate surface over 90 degrees C. or greater for drying to form the resist layer, exposing and developing the resist layer for patterning thereon.

The mask formation by the laser-grooving is achieved by applying a resin material solution on the substrate surface to form the resin layer, irradiating a laser beam onto a portion of the resin layer, and removing the irradiated portion of the resin layer for patterning thereon. The masking material used for the laser-grooving may include polyimide and polyvinyl alcohol, for example.

For example, Patent Document 1 (JP 2014-513868 A or WO 2012/125560 A2) discloses the plasma-dicing process using the resist mask. Also, Patent Document 2 (JP 2014-523112 A or WO 2012/173768 A2) discloses the plasma-dicing process using the resist layer formed by the laser-grooving step.

In the plasma-dicing process, the mask is formed before or after the substrate is adhered on the holding sheet. If the substrate is relatively thick causing less warpage or crack and easy to be handled by itself, then the mask may be formed on the substrate as a typical wafer process before the substrate with the mask thereon is adhered onto the holding sheet. However, the thicker substrate requires a longer time of the plasma process for individualization (dicing), and also requires the thicker mask for withstanding such a longer time of the plasma process, so that the production yield is likely reduced. For this reason, it is preferable to make the substrate thinner by grinding it and to adhere the thinner substrate onto the holding sheet before the plasma-dicing process, which shortens the plasma processing time and also thins the mask. On the other hand, when the mask is formed on the thinner substrate and then the substrate is adhered on the holding sheet, the thinner substrate is more susceptive to warpage and crack and more difficult to be handled, therefore the production yield is likely reduced. Thus, if the substrate may be adhered on the holding sheet before the mask is formed, it would be expected to produce the substrate which is less susceptive to be damaged, thereby to improve the productivity and the production yield. But this causes drawbacks as follows.

The holding sheet typically used in the dicing process is made of thermoplastic resin which has less heat tolerance. Therefore, if the substrate is processed at a high temperature which may soften the holding sheet when forming the mask of the resist or resin, the holding sheet undergoes deformation (expansion/shrinkage and curvature) which prevents the wafer from being maintained in a flat configuration. The deformed wafer deteriorates the patterning accuracy in the mask formation step, and also causes the holding sheet and the substrate to be insufficiently cooled in the plasma processing step, which eventually reduces the production yield of the element chips as the finished products.

In the meanwhile, when the mask is formed by the photolithography technique, if the liquid resist is not dried enough due to shortage of the heating step in the mask formation, the patterning accuracy of the resist mask in an exposing step is deteriorated. Also, so-called a mask burning or a resist burning is caused to damage the resist mask with deformation by heat in the plasma processing step. Similarly, when the mask is formed by the laser grooving step, the mask burning is caused in the plasma processing step due to the insufficient heating in the mask formation.

SUMMARY

The first aspect of the present invention relates to a manufacturing process of an element chip, which comprises a preparing step for preparing a substrate having first and second surfaces opposing each other and containing a plurality of element regions and dicing regions defining the element regions, a holding step for holding the second surface of the substrate and an annular frame around the substrate with a holding sheet, an applicating step for applying a resin material solution containing a resin constituent and a solvent on the first surface of the substrate to form a coated layer containing the resin constituent and the solvent thereon, a heating step for providing a heat from a heat source to the substrate held on the holding sheet through a heat shielding member which shields the frame and the holding sheet from the heat, to substantially remove the solvent from the resin material solution, thereby to form a resin layer, a patterning step for patterning the resin layer to expose the first surface in the dicing regions of the substrate, and a dicing step for dicing the substrate into a plurality of element chips by plasma-etching the substrate from the first surface through the second surface.

The second aspect of the present invention relates to a substrate heating apparatus for heating a substrate held on a conveying carrier, the conveying carrier including a holding sheet and a frame arranged on a periphery of the holding sheet, the substrate having first and second surfaces opposing each other, and the second surface being held on the holding sheet, said substrate heating apparatus comprises a supporting member supporting the conveying carrier, a heat source opposing to the first surface of the substrate for heating the first surface of the substrate, and a heat shielding member arranged between the heat source and the conveying carrier.

BRIEF DESCRIPTION OF THE DRAWINGS

FIG. 2A is a top plan view of a substrate, FIG. 2B is a cross sectional view taken along a line IIB-IIB of FIG. 2A, and FIG. 2C is a partially enlarged view of FIG. 2A.

DETAILED DESCRIPTION

Figure 1:
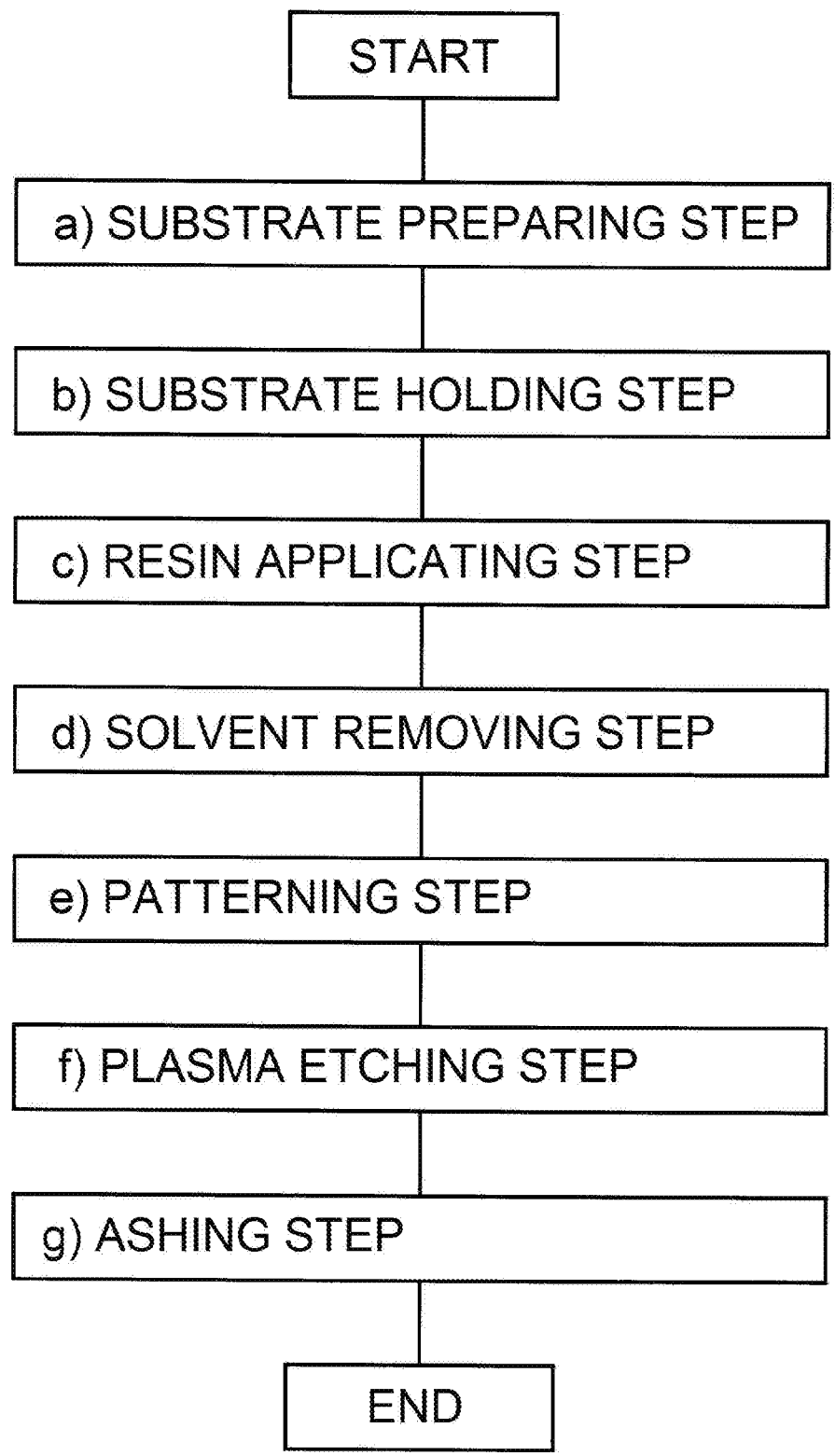
FIG. 1 is a flowchart illustrating a manufacturing process of an element chip according to an embodiment of the present invention.

With reference to attached drawings, a manufacturing process of an element chip according to an embodiment of the present invention will be described hereinafter. In the description, a couple of terms for indicating the directions (for example, "vertical" or "horizontal") are conveniently used just for facilitating clear understandings, it should not be interpreted that those terms limit the scope of the present invention. Also, in the drawings, each component of a substrate heating apparatus is illustrated in a relative manner in size for clarifying the shape and the feature thereof, and not necessary in the exact scale.

As depicted in FIG. 1, the manufacturing process of the element chip according to an embodiment of the present invention includes, in general, a) a step for preparing a substrate containing a plurality of element regions and dicing regions defining the element regions (substrate preparing step); b) a step for holding the substrate and a frame with a holding sheet (substrate holding step); c) a step for applying a resin material solution containing a resin constituent and a solvent on a surface of the substrate (resin applicating step); d) a step for removing the solvent substantially from the resin material solution to form a resin layer (solvent removing step or heating step); e) a step for patterning the resin layer to expose the surface of the substrate in the dicing regions (patterning step); f) a step for plasma-etching the substrate from the surface through another (bottom) surface to dice the substrate into a plurality of element chips (plasma etching step); and g) a step for removing the resin layer from the substrate (ashing step).

a) Substrate Preparing Step: The substrate 1 prepared in the substrate preparing step is to be diced into a plurality of element chips by means of a plasma etching technique. The substrate 1 may include a semiconductor substrate such as a silicon wafer, a resin substrate such as a flexible printed circuit board, or a ceramic substrate. Also, the semiconductor substrate may be made of silicon (Si), gallium arsenide (GaAs), gallium nitride (GaN), silicon carbide (SiC), and the present invention does not limit a particular material of the substrate.

FIG. 2A is a top plan view of the substrate, FIG. 2B is a cross sectional view taken along a line IIB-IIB of FIG. 2A, and FIG. 2C is a partially enlarged view of FIG. 2A. As depicted in FIG. 2B, the substrate 1 includes first and second surfaces 1a, 1b opposing each other, which may be referred to as a top surface 1a and a bottom surface 1b hereinafter. Also, as depicted in FIG. 2C, the substrate 1 contains a plurality of the element regions 1c and the dicing regions defining the element regions 1d on the top surface 1a. Each of the element regions 1c of the substrate 1 includes an integrated circuit composing a desired electrical circuit which is structured as the element chip 1c after the plasma etching step, and each of the dicing regions 1d defines dicing lines.

Although not limited thereto, the integrated circuit on each of the element regions 1c may contain a circuit layer composing a semiconductor circuit, an electrical component element, and/or MEMs, for example. The circuit layer may be configured as a multi-layered stack including an insulating layer, a conducting layer, a resin protecting layer, and an electrode pad. Furthermore, after forming the multi-layered stack, the bottom surface 1b of the substrate 1 may be ground to make the substrate 1 thinner.

Figure 3A:
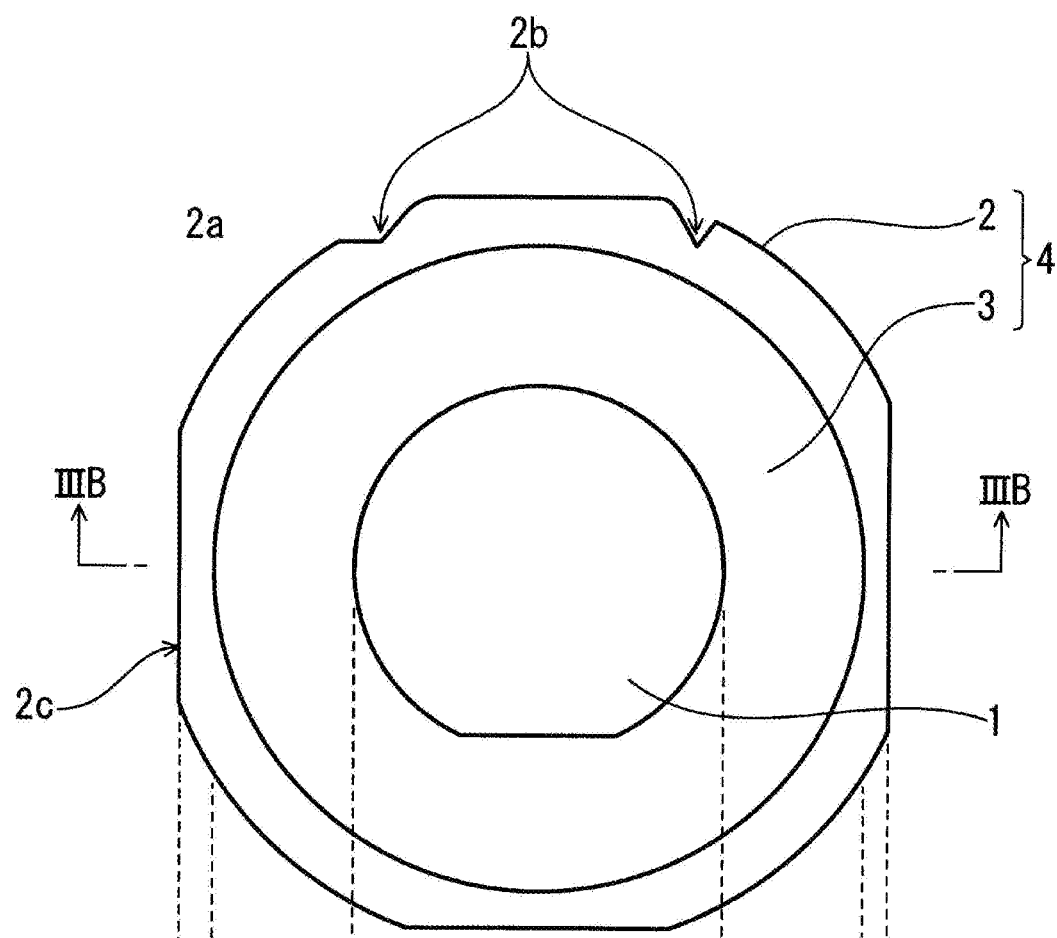
FIG. 3A is a top plan view of the substrate and an annular frame adhered on a holding sheet.
Figure 3B:
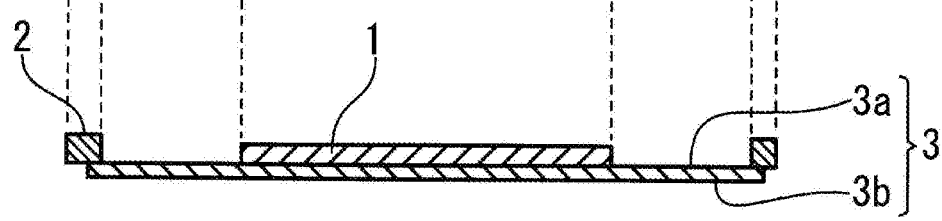
FIG. 3B is a cross sectional view taken along a line IIIB-IIIB of FIG. 3A.

Although the substrate 1 may have any planar shapes, the substrate 1 of the present embodiment substantially circular shape as depicted in FIG. 2A, of which maximum diameter is between about 50 mm-300 mm, and thickness is less than 150 μm or 100 μm, even less than 50 μm. The thinner substrate 1 provides higher superiority to adapt the plasma etching technique to dice the substrate 1. Besides the circular shape, the substrate 1 may have a rectangular planar shape, and also may include a cut-out such as an orientation flat (FIG. 2A) and a notch.

b) Substrate Holding Step: The substrate 1 and the annular frame 2 are held on the holding sheet 3 when a desired electrical integrated circuit is formed in the element regions 1c or at least prior to the resin applicating step as will be described later. FIG. 3A is a top plan view of the substrate 1 and the annular frame 2 adhered on the holding sheet 3, and FIG. 3B is a cross sectional view taken along a line IIIB-IIIB of FIG. 3A. The holding sheet 3 includes a top surface (adhesive surface 3a) with adhesive material and a bottom surface (non-adhesive surface 3b) without the adhesive material. The holding sheet 3 is adapted to hold the substrate 1 and the annular frame 2 by adhering them on the adhesive surface 3a of the holding sheet 3. The annular frame 2 having a circular opening 2a is adhered on the holding sheet 3, and the substrate 1 is adhered and arranged concentrically with the circular opening 2a of the frame 2. The adhesive surface 3a is exposed in the opening 2a which is not covered by the substrate 1. In the present disclosure, a combination of the holding sheet 3 and the frame 2 adhered thereon may be referred to as a conveying carrier, and substrate 1 adhered on the conveying carrier 4 may be referred to as an on-carrier substrate 1. Even if the substrate 1 itself is thin, as the substrate 1 is held by the conveying carrier 4, it can easily be treated and conveyed in the succeeding steps.

The backing member is formed of a thermoplastic resin including, for example, polyethylene, polyolefin such as polypropylene, and polyester such as polyethylene terephthalate. Also, after the ashing step as will be described later, the holding sheet 3 is designed to have a stretching property allowing it being removed from the frame 2 and being spread in a radial direction to expand a gap between the adjacent element chips 1c to facilitate peeling off and picking up each of the element chips 1c from the adhesive surface 3a thereof. In order to add the stretching property, the backing member of the holding sheet 3 may contain various additives including, for example, a rubber component for adding the stretching property (for example, ethylene-propylene rubber (EPM), ethylene-propylene-diene rubber (EPDM)), a plasticizer, a softener, an antioxidant, and a conductive material. The thermoplastic resin may contain a functional group showing a photopolymerization reaction such as an acryl group. Although not limited thereto, the backing member may have a thickness of 50-150 μm, for example.

The adhesive surface 3a may preferably contain an adhesive material of which adhesibility is weakened with an ultra-violet beam (UV-radiation). This allows each of the diced element chips obtained after the plasma dicing step to easily be peeled off and picked up from the adhesive surface 3a with the UV-radiation. The holding sheet 3 may be formed, for example, by applying an UV-curing acrylic adhesive on the adhesive surface 3a of a film-shaped backing member to have a thickness of 5-20 μm.

The frame 2 has such a rigidity that it can be transferred or delivered with the holding sheet 3 and the substrate 1 adhered thereon. Besides the circular shape, the opening 2a of the frame 2 may be formed in a polygonal shape (such as rectangular and hexagonal). The frame 2 may be provided with a notch 2b or a corner cut 2c for alignment thereof. Also, the frame 2 may be formed of a material including, for example, a metal such as aluminum and stainless steel, or a resin.

c) Resin Applicating Step: In the resin applicating step, the resin material solution (referred to as also a resist solution) containing the resin constituent and the solvent is applied on the surface 1a of the substrate 1 to form a coated layer 5 containing the resin constituent and the solvent. Any technique for applying the resist solution on the surface 1a of the substrate 1 may be applied if achieving an even coating of the resist solution thereon, for example, a spray applicator or a spin-coat applicator (not shown) may be used to apply the resist solution on the surface 1a of the substrate 1. The resist solution may be a photoresist material solution, which may be either positive or negative in photosensitivity. Also, the resist solution may be a water-soluble resin material solution.

Figure 4A:
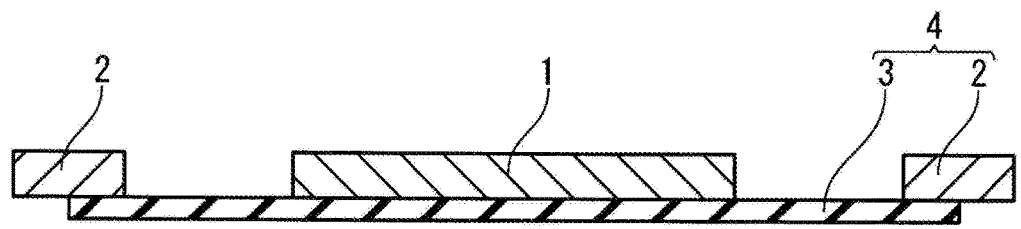
FIGS. 4A-4C are cross sectional views of a conveying carrier with the substrate adhered thereon, depicting it before and after a resist solution is applied thereon.
Figure 4B:
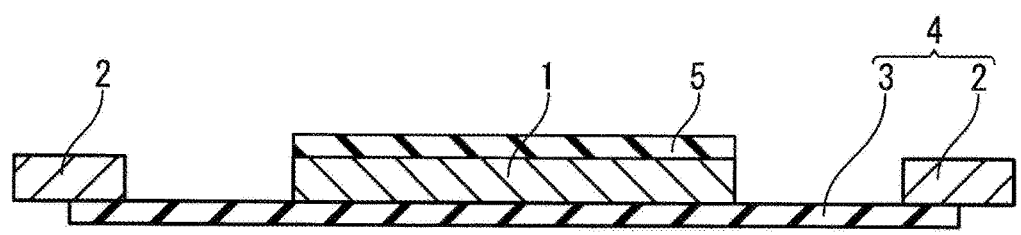

FIG. 4A is a cross sectional view of the conveying carrier 4 with the substrate 1 adhered thereon before the resist solution is applied on the surface 1a of the substrate 1. FIG. 4B is a cross sectional view of the conveying carrier 4 after the resist solution is applied by means of the spray applicator to form the coated layer 5 containing the resin constituent and the solvent. The spray applicator may be either an ink-jet applicator or an electrostatic spray applicator. The ink-jet applicator is configured to eject and deposit droplets of the resist solution on the surface 1a of the substrate 1. The electrostatic spray applicator is designed to spray an electrically charged resist solution onto the surface 1a of the substrate having a potential of the reverse polarity.

Figure 4C:
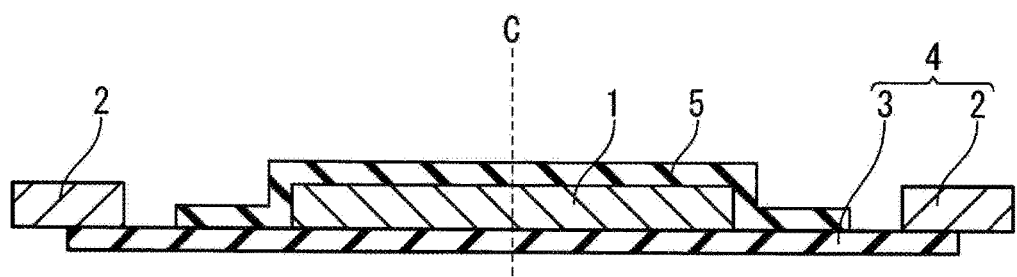

FIG. 4C is a cross sectional view of the conveying carrier 4 just after the resist solution is applied by means of the spin-coat applicator to form the coated layer 5 containing the resin constituent and the solvent, in which the redundant resist solution is spun out of the substrate 1 by the centrifugal force and covered on the periphery of the substrate 1 and a circumferential portion of the holding sheet 3 adjacent thereto. The spin-coat applicator is configured to apply the resist solution across the whole surface 1a of the substrate 1 by falling droplets of the resist solution on the substrate at the center C while rotating the substrate 1 around the vertical central axis thereof. After the redundant resist solution is dropped as depicted in FIG. 4C, an edge rinsing step may be performed to remove the redundant resist solution covered on the periphery of the substrate 1 and the circumferential portion of the holding sheet 3, so that the coated layer 5 is deposited only on the surface 1a of the substrate 1 as depicted in FIG. 4B.

d) Solvent Removing Step or Heating Step: As described above, since the resist solution contains the resin constituent and the solvent, the coated layer 5 deposited in the resin applicating step also contains the resin constituent and the solvent. The coated layer 5 deposited on the surface 1a of the substrate 1 is heated (pre-baked) to dry or remove the solvent contained in the coated layer 5, thereby to form the resin layer 6 (referred to as also a photoresist layer) on the surface 1a of the substrate 1.

When the photoresist material solution of photosensitivity is used as the resist solution, the resin constituent is composed of a primal photosensitive material, of which solubility to the developing solution varies upon radiation of the UV light such as I-line. The photosensitive material includes a novolac resin (phenolic resin), and the solvent includes propyleneglycol monomethylether acetate (PGMEA).

When the photoresist material solution of photosensitivity is used as the resist solution, the uncured coated layer 5 needs to be exposed to a high temperature of 90 degrees C. or greater to dry or remove the solution, so as to cure the resin constituent in a sufficient manner. This is because the remaining solvent or the insufficiently cured resin deteriorates a precise patterning during the heat exposure and development in the patterning step as will be described later. Another reason is because the remaining solvent or the insufficiently cured resin causes a problem of a mask burning in the plasma processing step also as will be described later.

When the water-soluble resist material solution is used as the resist solution, the resin constituent is composed of a primal material which may contain, for example, polyvinyl alcohol, polyacrylamide, polyvinylpyrrolidone, 2-acrylamido-2-methylpropanesulfonic acid, sodium polyacrylate, sodium polystyrenesulfonate, polystyrene lithium sulfonate, diallyldimethyl ammonium chloride as a main component. The solvent includes water and/or dimethylsulfoxide.

When the water-soluble resist material solution is used as the resist solution, the uncured coated layer 5 needs to be exposed to a high temperature of 90 degrees C. or greater to dry or remove the solvent, so as to cure the resin constituent in a sufficient manner. This is because the remaining solvent or the insufficiently cured resin causes a problem of a mask burning in the plasma processing step as will be described later.

However, since the holding sheet 3 holding the substrate 1 is made of thermoplastic resin containing the rubber component for adding stretching property, its heatproof temperature is about 60 degrees C., and therefore, it is required to maintain the temperature of the holding sheet 3 less than softening temperature (for example, 50 degrees C.

or less) so as to suppress the deformation (expansion/shrinkage and curvature) of the holding sheet 3 also during this heating step.

Figure 5A:
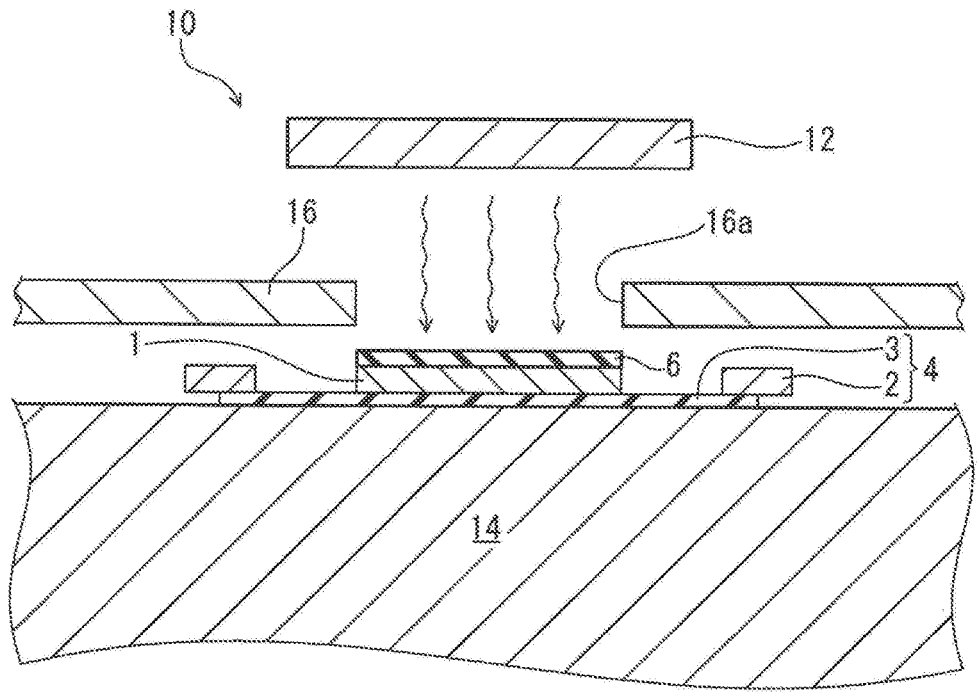
FIGS. 5A and 5B are cross sectional views schematically depicting a face-up substrate heating apparatus according to one embodiment of the present invention.
Figure 5B:
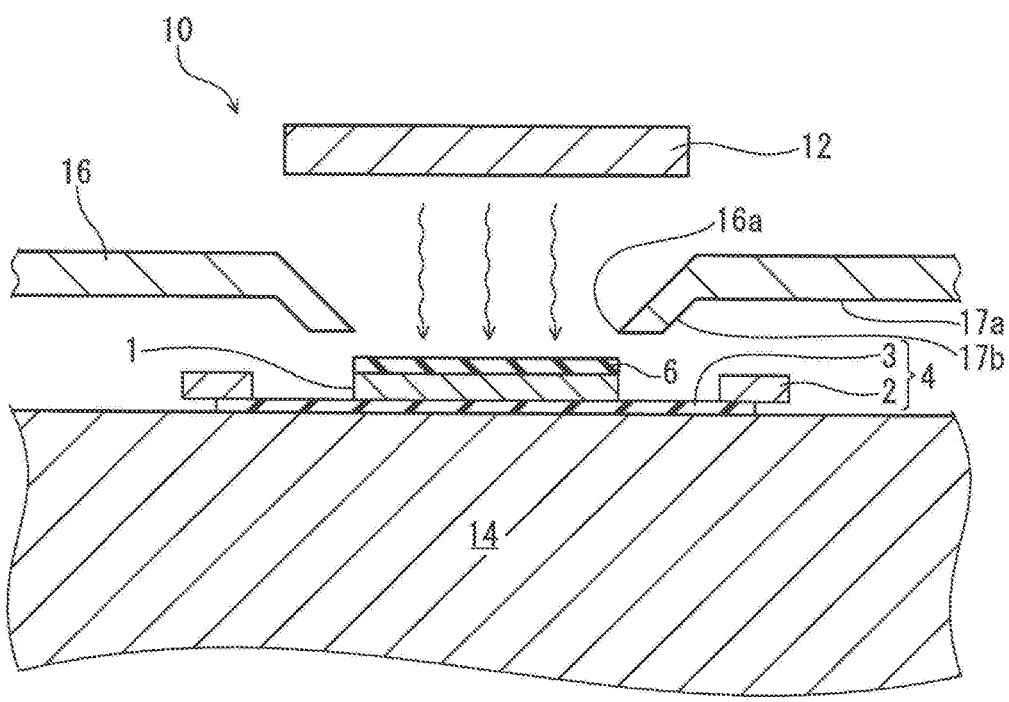

FIGS. 5A and 5B are cross sectional views schematically depicting a face-up substrate heating apparatus 10 according to one embodiment of the present invention. The substrate heating apparatus shown in FIG. 5 includes, in general, a heat source 12 such as an electrothermal heater and an infrared light lamp, a stage 14 supporting a holding sheet 3 with the frame 2 and the substrate 1 adhered thereon (the conveying carrier 4) by a vacuum suction, a heat shielding cover 16 (referred to also as a heat shielding member) which is arranged between the heat source 12 and the holding sheet 3 exposed by the opening 2a of the frame window 2a (and frame 2). Thus, the conveying carrier 4 includes the holding sheet 3 and the frame 2 arranged at the periphery of the holding sheet 3, and the substrate 1 has the first surface and the second surface opposite thereto which is adhered on the holding sheet 3.

The heat shielding cover 16 contains a window 16a having a planar shape same as one of a circumference of the substrate 1, and the heat shielding cover 16 is supported by the stage 14 having elevating rods (not shown) or connecting members connected thereto (not shown) movable in the vertical direction, and a housing of the substrate heating apparatus 10.

The heat shielding cover 16 is raised by the elevating rods so as to expand a space between the stage 14 and the heat shielding cover 16. A delivering mechanism such as a Bernoulli-chuck or a conveying arm (not shown) is used to deliver the conveying carrier 4 to a predetermined position in the substrate heating apparatus 10. Again, the elevating rods are used to lower the heat shielding cover 16 so as to arrange it close to the circumference of the substrate 1. When the heat shielding cover 16 is positioned downward, it is kept away from the substrate 1 in order to prevent the heat being transferred from the heat shielding cover 16 directly to the substrate 1. The heat source 12 so arranged is configured to, in conjunction with the heat shielding cover 16, heat only the surface at 90 degrees C. or greater and maintain the holding sheet 3 at 50 degrees C. or less.

Therefore, the substrate heating apparatus 10 according to the present embodiment of the invention can form the resin layer 6 by drying or removing the solvent sufficiently from the coated layer 5 by heating it at the high temperature of 90 degrees C. or greater, so as to achieve the accurate pattern on the resin layer 6 for avoiding reduction of a process margin, while the holding layer 3 having the stretching property is maintained at the relatively low temperature of 50 degrees C. or less so as to keep the shape unchanged, thereby to improve the production yield of the element chips 1c as the finished products. In other words, the heat shielding cover 16 is configured to shield the holding sheet 3 holding the substrate 1 from the heat, and to prevent deformation thereof, thereby to improve the production yield of the element chips 1c.

The heat shielding cover 16 is heated by the heat source 12, and especially in the case that it is made of metal, it has such a high thermal conduction rate that it provides substantial radiation heat to the holding sheet 3. To prevent this, the heat shielding cover 16 may be cooled down while the solvent removing step. As one example of the cooling mechanisms, the heat shielding cover 16 may contain the coolant passage allowing the coolant circulating with a cooling device (not shown), thereby to reduce the radiation heat to the holding sheet 3. Also, the elevating rods supporting the heat shielding cover 16 or the housing the of the substrate heating apparatus 10 (or any other connecting members thereto) may also be cooled to indirectly cool down the heat shielding cover 16. Furthermore, another coolant passage may be provided within the stage 14 supporting the holding sheet 3 (the conveying carrier) by the vacuum suction, so as to cool down the heat shielding cover 16.

The heat source 12 may be a convection fan blowing a hot air onto the substrate, however, an inflow of the hot air through a gap between the heat shielding cover 16 and the substrate 1 may heat the holding sheet at temperature at 50 degrees C. or greater. In this regard, the heat source 12 may preferably be the electrothermal heater and the infrared light lamp radiating the heat to the substrate 1. Also, when the heat source 12 is designed to provide the radiation heat, the heat shielding cover 16 may preferably include a reflecting film at least on the first surface opposing to the heat source 12 or the whole surfaces thereon, in order to reflect the radiation heat from the heat source 12 for reducing the heat received by the heat shielding cover 16.

Although the heat shielding cover 16 may have the flat cross section extending in the horizontal direction as depicted in FIG. 5A, it may include the second surface opposing to the conveying carrier 4 supported by the stage 4, which has a horizontal surface 17a (a ceiling surface in FIG. 5B) covering at least the frame 2 and an inclined surface 17b or a curved surface (convex upward, not shown) extending continuously from the horizontal surface 17a and gradually approaching to the holding sheet 3 that is exposed between the frame 2 and the substrate 1. The heat shielding cover 16 depicted in FIG. 5B may be configured to expand the gap from the holding sheet 3 to the horizontal surface 17a and the inclined surface 17b (or curved surface) so as to reduce the radiation heat from the heat shielding cover 16 to the holding sheet 3 for further reducing the heat applied to the heat shielding cover 16.

The substrate heating apparatus 10 depicted in FIGS. 5A and 5B are described as the face-up type in which the substrate 1 faces upward, but a face-down substrate heating apparatus may be also used, in which the substrate 1 faces downward as will be described herein with reference to FIGS. 6A-6C. The face-down substrate heating apparatus includes coupling members 18 extending in the horizontal direction from the housing and supporting the conveying carrier 4. The coupling members 18 are adapted to support the conveying carrier 4 so that the substrate 1 faces downward in the vertical direction. The face-down substrate heating apparatus may include a vacuum suction mechanism suspending the conveying carrier 4, instead of the coupling members 18. Similar to the face-up substrate heating apparatus, the face-down substrate heating apparatus 10 includes the heat source 12 such as the electrothermal heater and the infrared light lamp, and the heat shielding cover 16 which is arranged between the heat source 12 and the holding sheet 3 (and the frame 2).

The face-down substrate heating apparatus 10 shown in FIG. 6 needs to turn the conveying carrier 4 upside down, and thus requires additional flipping mechanism with the Bernoulli-chuck or the conveying arm which is more or less complex device than that of the face-up substrate heating apparatus. However, since such a versatile flipping mechanism is commercially available, it can easily be incorporated. Also, for example, a hot plate which is widely used and has a simple structure can conveniently be adapted as the heat source 12 in the face-down substrate heating apparatus 10, which allows easy and simple structure of the face-down substrate heating apparatus 10.

The coupling members 18 and the heat shielding cover 16 may be configured to be elevated in the vertical direction relative to the heat source 12 by means of an elevating mechanism (not shown). This allows the heat shielding cover 16 positioned close to the periphery of the substrate 1, but still away from the substrate 1 to prevent the heat transferring directly from the heat shielding cover 16 to the substrate 1.

The face-down substrate heating apparatus 10 may include a cooling mechanism for cooling down the heat shielding cover 16, which is similar to one described above for the face-down substrate heating apparatus. For example, the coolant passage for circulating the coolant within the heat shielding cover 16 is used to reduce the radiation heat from the heat shielding cover 16 to the holding sheet 3. The housing of the substrate heating apparatus 10 and/or the coupling members 18 may also be cooled to indirectly cool down the heat shielding cover 16.

Figure 6A:
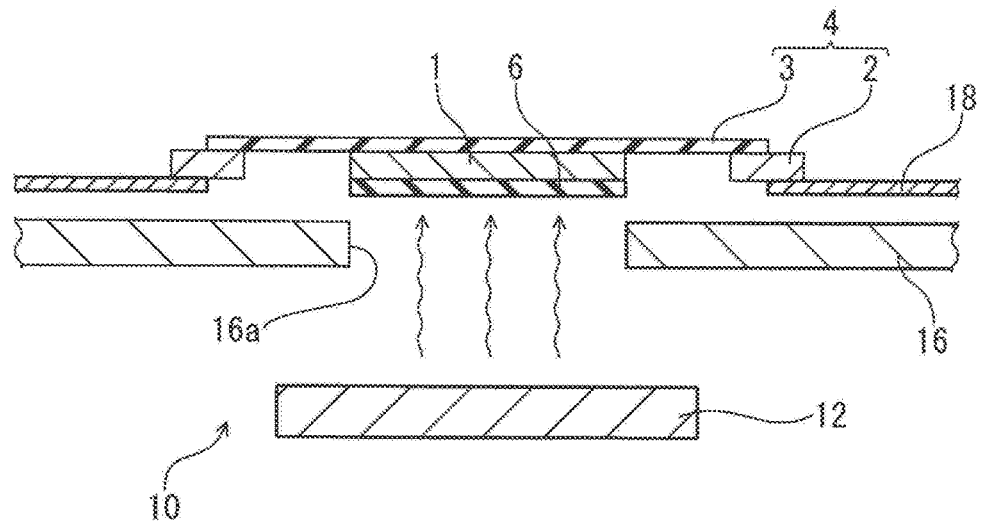
FIGS. 6A-6C are cross sectional views schematically depicting a face-down substrate heating apparatus according to another embodiment of the present invention.
Figure 6B:
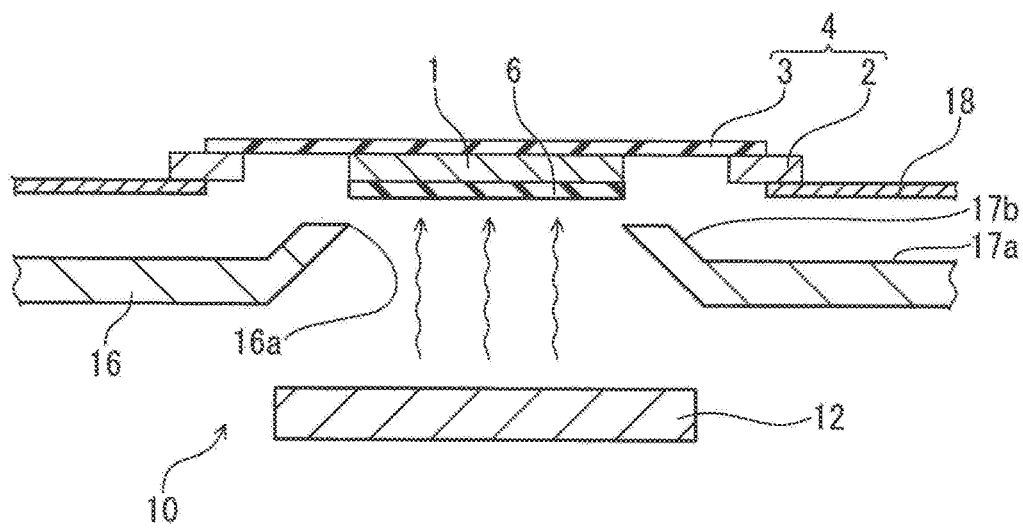
Figure 6C:
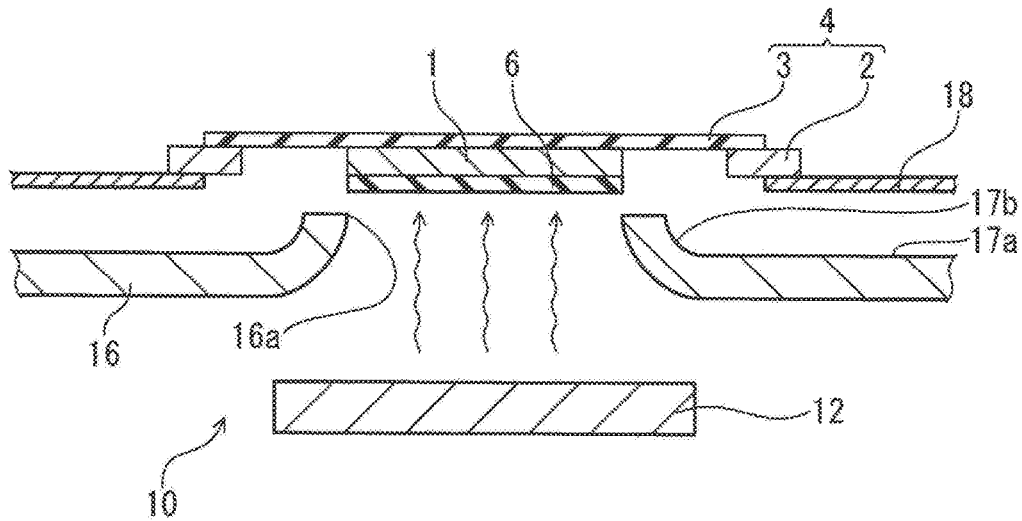

Although the heat shielding cover 16 may have the flat cross section extending in the horizontal direction as depicted in FIG. 6A, it may include the second surface opposing to the conveying carrier 4 supported by the coupling members 18, which has the horizontal surface 17a covering at least the frame 2 and the inclined surface 17b or a curved surface 17c (convex downward) extending continuously from the horizontal surface 17a and gradually approaching to the holding sheet 3 that is exposed between the frame 2 and the substrate 1. The heat shielding cover 16 depicted in FIGS. 6B and 6C may be configured to expand the gap from the holding sheet 3 to the horizontal surface 17a and the inclined surface 17b (or curved surface 17c) so as to reduce the radiation heat from the heat shielding cover 16 to the holding sheet 3 for further reducing the heat applied to the heat shielding cover 16.

In the aforementioned face-up type and face-down type of the substrate heating apparatuses 10, the heat source 12 is configured in conjunction with the heat shielding cover 16 to heat substantially only the surface 1a at 90 degrees C. or greater, and to maintain the holding sheet 3 at 50 degrees or less. Therefore, according to the embodiment of the present invention, the coated layer 5 can be heated at 90 degrees C. or greater to dry or remove the solvent sufficiently therefrom to form the resin layer 6. This allows the precise pattern on the resin layer 6, prevents reduction of the process margin, and keep the holding sheet 3 at 50 degrees or less to avoid the curvature thereof, all of which improve the production yield of the element chips 1c.

e) Patterning Step: The patterning step is to pattern on the resin layer 6 to expose the surface 1a of the substrate 1 in the dicing regions 1d. When the photoresist material solution of photosensitivity is used as the resist solution, the patterning step includes, in particular, an exposing step for radiating a UV light on the resin layer 6 (photoresist layer) at the pattered regions corresponding to the dicing regions 1d of the substrate 1, a developing step for removing the resin layer 6 in the dicing regions 1d with a developing solution, and a rinsing step for rinsing the remaining developing solution with a flesh water.

In the exposing step, although not limited thereto, the I-line as one example of the UV light may be irradiated on the resin layer 6 (photoresist layer) to modify the solubility thereof to the developing solution. In the developing step, the developing solution and the developing process (a dip development or a spray development) suitable for characteristics of the resin layer 6 (photoresist layer) are used for removing the resin layer 6 (photoresist layer) in the dicing regions 1d of the substrate 1. Also, in order to enhance the following plasma etching step for plasma-etching the substrate 1 in the dicing regions, the resin layer 6 (photoresist layer) has to securely be removed from the dicing regions 1d. In the rinsing step, the developing solution is well rinsed with a pure water or a dedicated rinsing solution, and then the pure water is dried. The holding sheet 3 is maintained at the temperature of 50 degrees or less to prevent the warpage in each of the sub-steps of the patterning step. To this end, the resin layer 6 is patterned to expose the dicing regions 1d on the surface 1a of the substrate 1.

Besides the photolithography technique, the patterning step may be achieved in any way, for example by a laser grooving technique. In this case, the photoresist material solution or the water-soluble resin material solution may be used as the resist solution. When adapting the laser grooving technique, a nanosecond laser having a UV wavelength (e.g., 355 nm) is used as the laser beam source. The pulse laser of which pulse period is 40 kHz, output power is 0.3 W, and scanning rate is 200 m/second is irradiated onto the dicing regions 1d to remove the resin layer 6, thereby to expose the dicing regions 1d of the substrate 1.

f) Plasma Etching Step: The plasma etching step is to plasma-etching the substrate 1 in the dicing regions 1d exposed in the patterning step, from the surface 1a through the bottom surface 1b of the substrate 1, thereby to dice it into a plurality of the element chips 1c.

Although not illustrated in detail, one example of the plasma etching step and a dry etching apparatus used for the step will be described herein. The dry etching apparatus includes a processing chamber having a gas inlet connected to a processing gas source and an ashing gas, and a gas outlet connected to a vacuum pump. After the conveying carrier 4 (and the substrate 1) is seated on the stage within the processing chamber, the processing chamber is decompressed by the vacuum pump, and a predetermined processing gas is introduced into the chamber. Then, an antenna of the dry etching apparatus (a plasma generator) is supplied with a high-frequency power to generate the plasma atmosphere of the processing gas, in which the substrate 1 is dry-etched along the dicing regions 1d thereof and is diced into a plurality of the element chips each having the element region 1c.

The dry etching apparatus also includes a controller which controls the processing gas source, the ashing gas source, the vacuum pump, and a high-frequency power source so as to perform the plasma etching step in the optimized dry etching condition.

g) Ashing Step: The ashing step is to remove the resin layer 6 after the plasma etching step. The ashing step may be made subsequently within the same chamber as one for the dry etching step. In the ashing step, the ashing gas such as oxygen gas is introduced into the processing chamber, and the antenna of the dry etching apparatus (plasma generator) is supplied with the high-frequency power to generate the plasma atmosphere of the ashing gas, in which the resin layer 6 is removed from the surface 1a of the substrate 1.

REFERENCE NUMERALS

1: substrate
   1a: top surface, 1b: bottom surface
   1c: element region (element chip)
   1d: dicing region
2: frame
   2a: opening
3: holding sheet
   3a: adhesive surface 3b: non-adhesive surface
4: conveying carrier
5: coated layer
6: resin layer
10: substrate heating apparatus
12: heat source
14: stage
16: heat shielding cover
  16a: window
  17a: horizontal surface
  17b: inclined surface
  17c: curved surface
18: coupling member

What is claimed is:

1. A manufacturing process of an element chip, comprising:
   a preparing step for preparing a substrate having first and second surfaces opposing each other and containing a plurality of element regions and dicing regions defining the element regions;
   a holding step for holding the second surface of the substrate and an annular frame around the substrate with a holding sheet;
   an applicating step for applying a resin material solution containing a resin constituent and a solvent on the first surface of the substrate to form a coated layer containing the resin constituent and the solvent thereon;
   a heating step for providing a heat from a heat source to the substrate held on the holding sheet through a heat shielding member which shields the frame and the holding sheet from the heat, to substantially remove the solvent from the coated layer, thereby to form a resin layer;
   a patterning step for patterning the resin layer to expose the first surface in the dicing regions of the substrate; and
   a dicing step for dicing the substrate into a plurality of element chips by plasma-etching the substrate from the first surface through the second surface.

2. The manufacturing process according to claim 1, wherein the holding sheet contains a thermoplastic resin, and
   wherein the resin layer is heated to a temperature higher than a softening temperature of the thermoplastic resin while maintaining the holding sheet at a temperature less than the softening temperature of the thermoplastic resin in the heating step.

3. The manufacturing process according to claim 2, wherein the resin layer contains a novolac resin having a photosensitivity, and
   wherein the patterning step includes a substep for exposing the resin layer and a substep for developing the exposed resin layer.

4. The manufacturing process according to claim 2, wherein the resin layer contains water-soluble resin, and
   wherein the patterning step is performed by irradiating a laser beam on regions of the resin layer and removing the resin layer in the regions irradiated by the laser beam.

5. The manufacturing process according to claim 1, wherein the heating step is performed while the heat shielding member is cooled down.

6. The manufacturing process according to claim 1, wherein the heat source includes a radiation heat source providing a radiation heat, and the heating step includes a substep for providing the radiation heat on the first surface of the substrate, and
   wherein the heat shielding member includes a reflecting layer on a surface thereof.

7. The manufacturing process according to claim 1, wherein the first surface of the substrate faces up in a vertical direction and is provided with the heat from the heat source arranged over the substrate.

8. The manufacturing process according to claim 1, wherein the first surface of the substrate faces down in a vertical direction and is provided with the heat from the heat source arranged below the substrate.

9. The manufacturing process according to claim 1, wherein the heat shielding member is spaced away from the substrate and the frame during the heating step.

10. The manufacturing process according to claim 1, wherein the heating step includes providing the heat from the heat source through a window in the heat shielding member.

11. A substrate heating apparatus for heating a substrate held on a conveying carrier, the conveying carrier including a holding sheet and a frame arranged on a periphery of the holding sheet, the substrate having first and second surfaces opposing each other, and the second surface being held on the holding sheet,
    said substrate heating apparatus, comprising:
    a supporting member supporting the conveying carrier;
    a heat source opposing to the first surface of the substrate for heating the first surface of the substrate, the heat source being a convection fan, an electrothermal heater, or an infrared light lamp;
    a heat shielding member arranged between the heat source and the conveying carrier.

12. The substrate heating apparatus according to claim 11, wherein the heat source includes a radiation heat source for heating the first surface of the substrate, and
    wherein the heat shielding member includes a reflecting layer on the first surface opposing to the heat source.

13. The substrate heating apparatus according to claim 11, wherein the heat shielding member is spaced away from the conveying carrier supported by the supporting member.

14. The substrate heating apparatus according to claim 11, wherein the heat shielding member has a second surface opposing to the conveying carrier supported by the supporting member, and the second surface has a horizontal surface covering at least the frame and an inclined surface extending continuously from the horizontal surface and gradually approaching to the holding sheet exposed between the frame and the substrate.

15. The substrate heating apparatus according to claim 11, wherein the supporting member is a stage for supporting the substrate and the holding sheet holding the substrate, and
    wherein the heat source is arranged over the conveying carrier.

16. The substrate heating apparatus according to claim 11, wherein the supporting member is provided so as to suspend the frame with the first surface facing down, and
    wherein the heat source is arranged below the conveying carrier.

17. The substrate heating apparatus according to claim 11, further comprising a cooling mechanism for cooling the heat shielding member.

18. The substrate heating apparatus according to claim 11, wherein the heat shielding member is configured to, during heating of the substrate, remain spaced from an annular frame and a holding sheet coupled to the substrate.

* * * * *